(12) United States Patent
Mo et al.

(10) Patent No.: US 9,972,771 B2
(45) Date of Patent: May 15, 2018

(54) MRAM DEVICES AND METHODS OF FORMING THE SAME

(71) Applicant: Taiwan Semiconductor Manufacturing Co., Ltd., Hsinchu (TW)

(72) Inventors: Chun-Chieh Mo, Kaohsiung (TW);
Shih-Chi Kuo, Taoyuan (TW);
Tsung-Hsien Lee, Tainan (TW);
Wu-An Weng, Hsinchu (TW);
Chung-Yu Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days. days.

(21) Appl. No.: 15/080,569

(22) Filed: Mar. 24, 2016

(65) Prior Publication Data

US 2017/0279036 A1    Sep. 28, 2017

(51) Int. Cl.
*H01L 43/08*    (2006.01)
*H01L 43/02*    (2006.01)
*H01L 43/12*    (2006.01)

(52) U.S. Cl.
CPC ............. *H01L 43/08* (2013.01); *H01L 43/02* (2013.01); *H01L 43/12* (2013.01)

(58) Field of Classification Search
CPC .......... H01L 43/02; H01L 43/08; H01L 43/12
See application file for complete search history.

(56) References Cited

U.S. PATENT DOCUMENTS

| | | | | |
|---|---|---|---|---|
| 7,579,197 B1* | 8/2009 | Li | ............ | H01L 43/08 257/E21.665 |
| 9,647,200 B1* | 5/2017 | Annunziata | ............ | H01L 43/02 |
| 2009/0174015 A1* | 7/2009 | Gu | ............ | G11C 11/16 257/421 |
| 2009/0194832 A1* | 8/2009 | Li | ............ | G11C 11/15 257/421 |
| 2010/0240189 A1* | 9/2010 | Jeong | ............ | H01L 21/7684 438/385 |
| 2011/0008915 A1* | 1/2011 | Nozieres | ............ | G11C 11/16 438/3 |
| 2011/0129946 A1* | 6/2011 | Zhong | ............ | H01L 27/228 438/3 |
| 2011/0233696 A1* | 9/2011 | Li | ............ | G11C 11/5607 257/421 |
| 2016/0351797 A1* | 12/2016 | Yi | ............ | H01L 43/08 |
| 2017/0162626 A1* | 6/2017 | Annunziata | ............ | H01L 43/12 |
| 2017/0162782 A1* | 6/2017 | Annunziata | ............ | H01L 43/12 |

* cited by examiner

Primary Examiner — Allan R Wilson
(74) Attorney, Agent, or Firm — JCIPRNET

(57) ABSTRACT

MRAM devices and methods of forming the same are provided. One of the MRAM devices includes a dielectric layer, a resistance variable memory cell and a conductive layer. The dielectric layer is over a substrate and has an opening. The resistance variable memory cell is in the opening and includes a first electrode, a second electrode and a magnetic tunnel junction layer between the first electrode and the second electrode. The conductive layer fills a remaining portion of the opening and is electrically connected to one of the first electrode and the second electrode of the resistance variable memory cell.

18 Claims, 8 Drawing Sheets

MRAM DEVICES AND METHODS OF FORMING THE SAME

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell. Various techniques directed at configurations and materials of MRAMs have been implemented to try and further improve device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
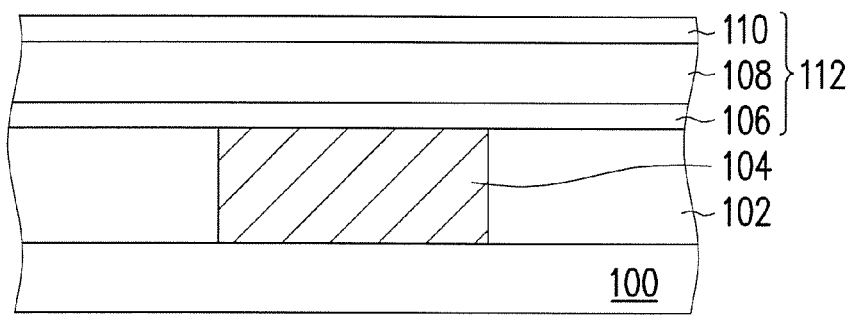
FIG. 1A to FIG. 1E are schematic cross-sectional views of a method of forming a MRAM device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1E are schematic cross-sectional views of a method of forming a MRAM device in accordance with some embodiments. FIG. 2 is a flow chart of a method of forming a MRAM device in accordance with some embodiments. It is noted that additional process steps may be provided before, during, or after the steps of FIG. 2. Various figures have been simplified for a better understanding of the inventive concepts of the present disclosure.

Figure 2:
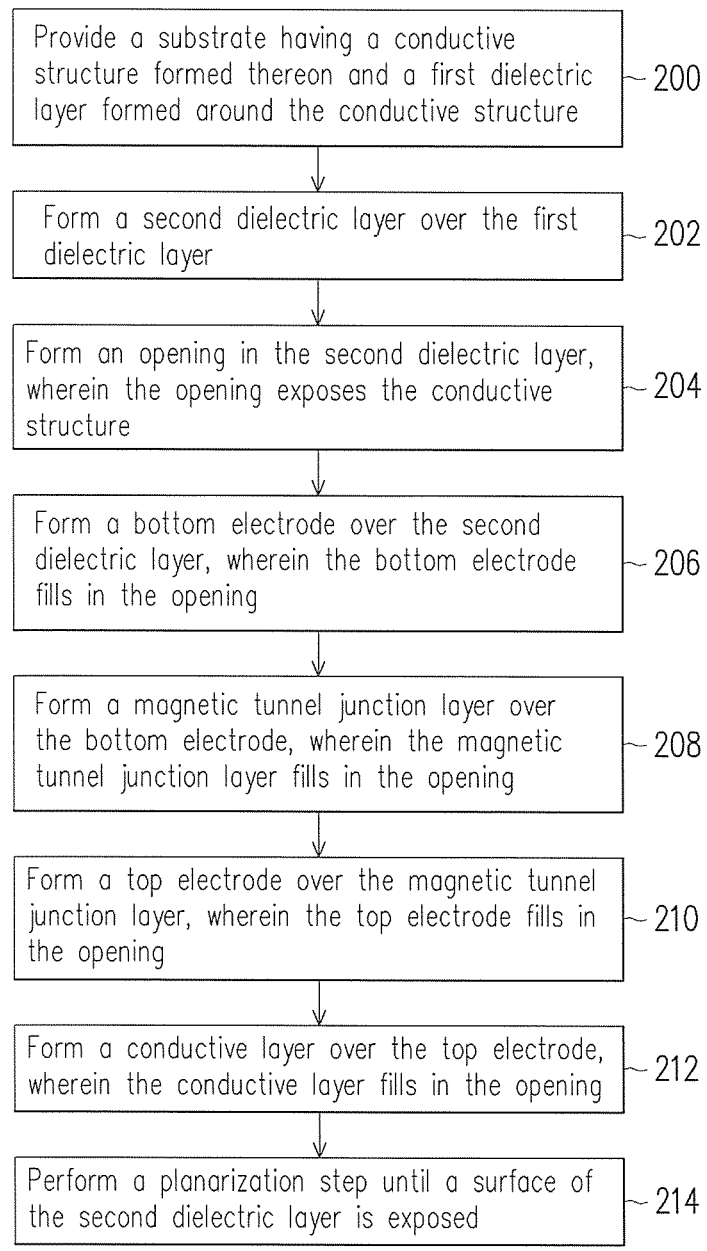
FIG. 2 is a flow chart of a method of forming a MRAM device in accordance with some embodiments.

Referring to FIG. 1A and FIG. 2, in step 200, a substrate 100 is provided with a conductive structure 104 formed thereon and a first dielectric layer 102 formed around the conductive structure 104.

In some embodiments, the substrate 100 includes an elementary semiconductor such as silicon or germanium and/or a compound semiconductor such as silicon germanium, silicon carbide, gallium arsenic, indium arsenide, gallium nitride or indium phosphide. In some embodiments, the substrate 100 is a semiconductor-on-insulator (SOI) substrate. In various embodiments, the substrate 100 may take the form of a planar substrate, a substrate with multiple fins, nanowires, or other forms known to people having ordinary skill in the art. In some embodiments, various layers and/or device structures are formed over or in the substrate 100. Such layers include dielectric layers, doped layers, polysilicon layers, metal layers or combinations thereof. Such device structures include transistors, resistors, and/or capacitors, which may be interconnected through an interconnect layer to additional integrated circuits.

In some embodiments, the conductive structure 104 is a metal line embedded in the first dielectric layer 102. In alternative embodiments, the conductive structure 104 is a metal plug (or called "metal via") formed through the first dielectric layer 102. In yet alternative embodiments, the conductive structure 104 is a metal gate or a polysilicon gate surrounded by the first dielectric layer 102. In still alternative embodiments, the conductive structure 104 includes at least one of a metal line, a metal plug, a metal gate, a polysilicon gate, a silicide layer and a doped layer.

In some embodiments, the conductive structure 104 includes Al, Cu, Mo, Ti, TiN, Ta, TaN, W, WN, NiSi, CoSi or a combination thereof. In some embodiments, the first dielectric layer 102 includes silicon oxide, fluorinated silica glass (FSG), carbon doped silicon oxide, silicon nitride, silicon oxynitride, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, a low-k dielectric material having a dielectric constant less than about 4 or a combination thereof.

In some embodiments, the conductive structure 104 is formed after the formation of the first dielectric layer 102. In alternative embodiments, the conductive structure 104 is formed prior to the formation of the first dielectric layer 102. The method of forming the conductive structure 104 and the first dielectric layer 102 includes performing suitable process steps, including deposition, lithography patterning, doping, implanting, and/or etching.

Continue referring to FIG. 1A and FIG. 2, in step 202, a second dielectric layer 112 is formed over the first dielectric layer 102. In some embodiments, the second dielectric layer 112 has a material the same as that of the first dielectric layer 102. In alternative embodiments, the second dielectric layer 112 has a material different from that of the first dielectric layer 102. In some embodiments, the second dielectric layer 112 includes, from bottom to top, an optional etching stop layer 106, an interlayer 108 and an optional polishing stop layer 110.

The etching stop layer 106 is optionally formed over the conductive structure 104 and the first dielectric layer 102. The etching stop layer 106 is configured to prevent the adjacent element (e.g., conductive structure 104) from being damaged during the subsequent etching step of defining the opening. In some embodiments, the etching stop layer 106 includes a dielectric material such as SiN, SiC, SiCN, SiON, SiCON or a combination thereof, and the forming method thereof includes performing a suitable deposition process, such as chemical vapor deposition (CVD), atomic layer deposition (ALD), plasma enhanced CVD (PECVD) or the like.

The interlayer 108 is formed over the etching stop layer 106. The interlayer 108 includes silicon oxide, FSG, carbon doped silicon oxide, silicon nitride, silicon oxynitride, TEOS oxide, PSG, BPSG, Black Diamond® (Applied Materials of Santa Clara, Calif.), amorphous fluorinated carbon, a low-k dielectric material having a dielectric constant less than about 4 or a combination thereof, and the forming method thereof includes performing a suitable technique, such as CVD, ALD, high density plasma CVD (HDPCVD), spinning coating or the like.

The polishing stop layer 110 is optionally formed over the interlayer 108. The polishing stop layer 110 is configured to prevent the adjacent element (e.g., interlayer 108) from being damaged during the subsequent polishing step. In some embodiments, the polishing stop layer 110 includes a dielectric material such as SiN, SiC, SiCN, SiON, SiCON or a combination thereof, and the forming method thereof includes performing a suitable deposition process, such as CVD, ALD, PECVD or the like.

Figure 1B:
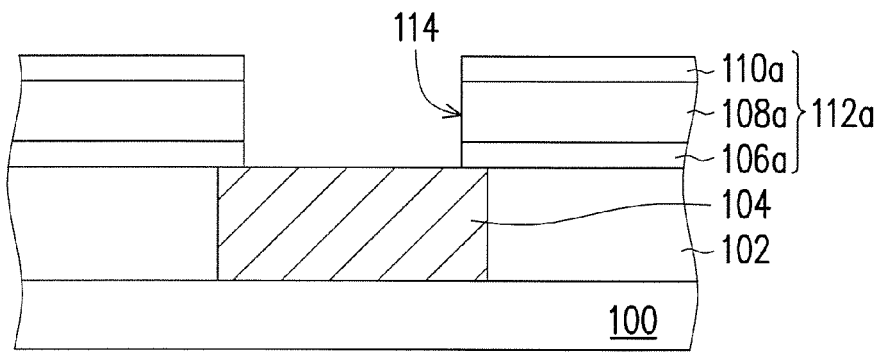

Referring to FIG. 1B and FIG. 2, in step 204, an opening 114 is formed in the second dielectric layer 112. In some embodiments, the opening 114 penetrates through the second dielectric layer 112 and exposes at least a portion of the conductive structure 104. During the formation stage for the opening 114, the etching stop layer 106 has an etching resistance higher than that of the interlayer 108 or the polishing stop layer 110, so the etching stop layer 116 prevents the etching process from going down to the dielectric layers 102 and the conductive structure 104. In the step of forming the opening 114, the second dielectric layer 112 is partially removed to form a second dielectric layer 112a including, from bottom to top, an optional etching stop layer 106a, an interlayer 108a and an optional polishing stop layer 110a. In some embodiments, the width of the opening 114 is smaller than the width of the conductive structure 104. In some embodiments, the opening 114 is a contact opening, a via opening, a conductive line trench or a damascene opening. In some embodiments, the opening 114 is formed by a suitable process, such as photolithography etching processes.

Figure 1C:
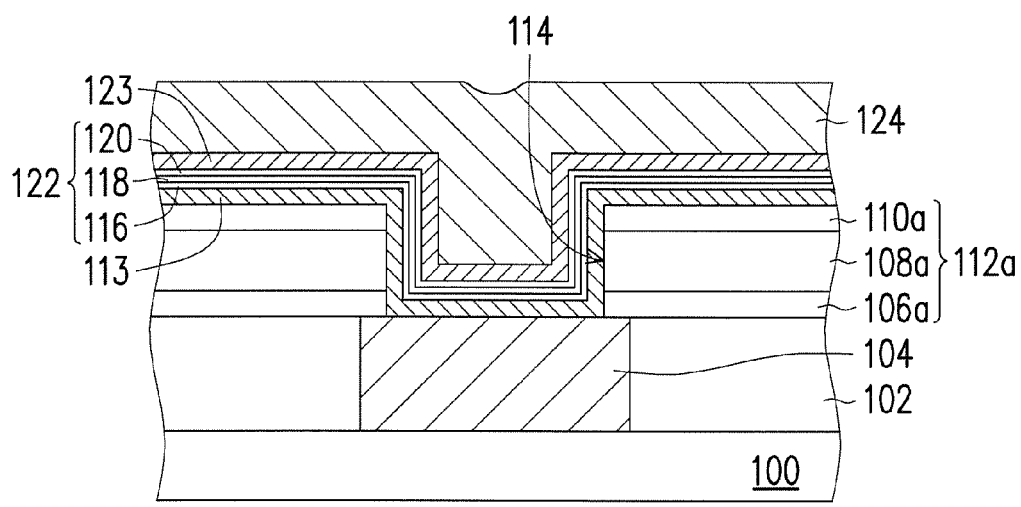

Referring to FIG. 1C and FIG. 2, in step 206, a bottom electrode 113 is formed over the second dielectric layer 112a and fills in the opening 114. In some embodiments, the bottom electrode 113 is conformally formed on the top surface of the second dielectric layer 112a and on the sidewall and bottom of the opening 114. In some embodiments, the bottom electrode is in physical contact with the conductive structure 104. In alternative embodiments, the bottom electrode is electrically connected to the conductive structure 104 through one or more conductive elements. In some embodiments, the bottom electrode 113 includes Pt, Al, Cu, AlCu, Au, Ti, TiN, Ta, TaN, W, WN or a combination thereof, and is formed by a suitable technique such as electroless plating, sputtering, electro plating, PVD, CVD, ALD or the like. In some embodiments, when the conductive structure 104 and the bottom electrode 113 are made by different materials, an optional barrier layer s formed between the conductive structure 104 and the bottom electrode 113. The barrier layer prevents diffusion between the conductive structure 104 and the bottom electrode 113 and/or any junction spiking. In some embodiments, the barrier layer includes at least one of TiN, Ti, Ta, TaN, W and WN, and is formed by a suitable technique such as electroless plating, sputtering, electro plating, PVD, CVD, ALD or the like.

Continue referring to FIG. 1C and FIG. 2, in step 208, a magnetic tunnel junction (MTJ) layer 122 is formed over the bottom electrode 113 and fills in the opening 114. In some embodiments, the MTJ layer 122 is conformally formed on the surface of the top electrode 113 outside and inside the opening 114. In some embodiments, the MTJ layer 122 has a resistivity capable of switching between a high resistance state and a low resistance state (or conductive), by application of an electrical voltage.

In some embodiments, the MTJ layer 122 includes a high-k dielectric material having a dielectric constant greater than about 8, a binary metal oxide, a transition metal oxide or a combination thereof. In some embodiments, the MTJ layer 122 includes a fixed layer 116, a free layer 120 and a tunnel layer 118 between the fixed layer 116 and the free layer 120. In some embodiments, the fixed layer 116 is in physical contact with the bottom electrode 113.

The fixed layer 116 and the free layer 120 form two ferromagnetic plates, each of which can hold a magnetic field, separated by the tunnel layer 118. The fixed layer 116 has a fixed magnetic polarity, and the free layer 120 has a changeable magnetic polarity to match an external field to store data. Due to a magnetic tunnel effect, the electrical resistance of the MTJ layer 122 changes based on the orientation of the magnetic fields in the two plates, i.e., the fixed layer 116 and the free layer 120. The MTJ layer 122 has lower resistance if the two plates have the same polarity and higher resistance if the two plates are of opposite polarity in some embodiments.

In some embodiments, the fixed layer 116 includes a synthetic anti-ferromagnetic (SAF) structure. In some embodiments, the fixed layer 116 includes a top pinned layer in physical contact with the tunnel layer 118, a bottom pinned layer and a metal layer between the top pinned layer and the bottom pinned layer. For example, each of the top pinned layer and the bottom pinned layer includes CoFeB, NiFe, CoFe, Fe or a suitable material, and the metal layer includes Ru, Cu, Ta or a suitable material. In some embodiments, the tunnel layer 118 includes MgO, $Al_2O_3$ or a suitable material. In some embodiments, the free layer 120 includes a magnetic material, such as CoFeB, NiFe, CoFe, Fe or a suitable material. In some embodiments, the MTJ layer 122 can be manufactured with a suitable technique, such as magnetron sputter deposition, molecular beam epitaxy, pulsed laser deposition, electron beam physical vapor deposition, CVD, ALD or a suitable method.

Still referring to FIG. 1C and FIG. 2, in step 210, a top electrode 123 is formed over the MTJ layer 122 and fills in the opening 114. In some embodiments, the top electrode 123 is conformally formed on the surface of the MTJ layer 122 outside and inside the opening 114. In some embodiments, the top electrode 123 has a material the same as that of the bottom electrode 113. In alternative embodiments, the top electrode 123 has a material different from that of the bottom electrode 113. In some embodiments, the top electrode 123 includes Pt, Al, Cu, AlCu, Au, Ti, TiN, Ta, TaN, W, WN or a combination thereof, and is formed by a suitable technique such as electroless plating, sputtering, electro plating, PVD, CVD, ALD or the like.

Continue referring to FIG. 1C and FIG. 2, in step 212, a conductive layer 124 is formed over the top electrode 123 and fills in the opening 114. In some embodiments, the conductive layer 124 is formed on the surface of the top electrode 123 and fills up the opening 114. In some embodiments, the conductive layer 124 includes Al, Cu, Mo, Ti, TiN, Ta, TaN, W, WN or a combination thereof, and is formed by suitable technique such as electroless plating, sputtering, electro plating, PVD, CVD, ALD or the like. In some embodiments, the conductive layer 124 has a material the same as that of the conductive structure 104. In alternative embodiments, the conductive layer 124 has a material different from that of the conductive structure 104.

In some embodiments, when the conductive layer 124 and the top electrode 123 are made by different materials, an optional barrier layer is formed between the conductive layer 124 and the top electrode 123. The barrier layer prevents diffusion between the conductive layer 124 and the top electrode 123 and/or any junction spiking. In some embodiments, the barrier layer includes at least one of TiN, Ti, Ta, TaN, W and WN, and is formed by a suitable technique such as electroless plating, sputtering, electro plating, PVD, CVD, ALD or the like.

Figure 1D:
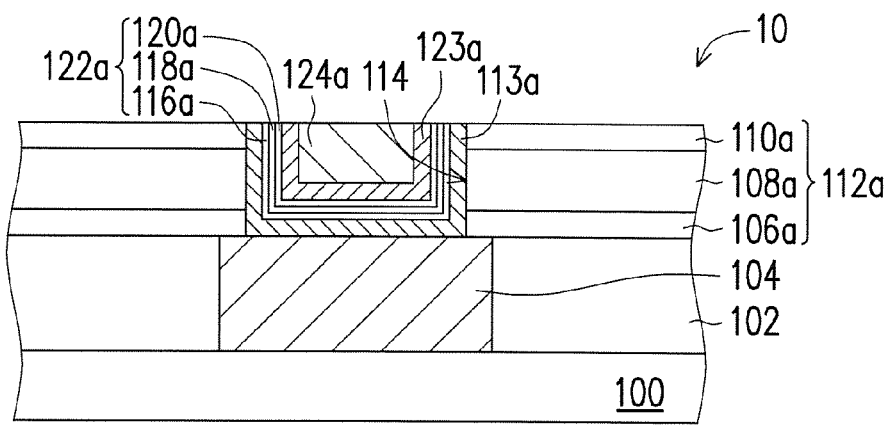
Figure 1E:
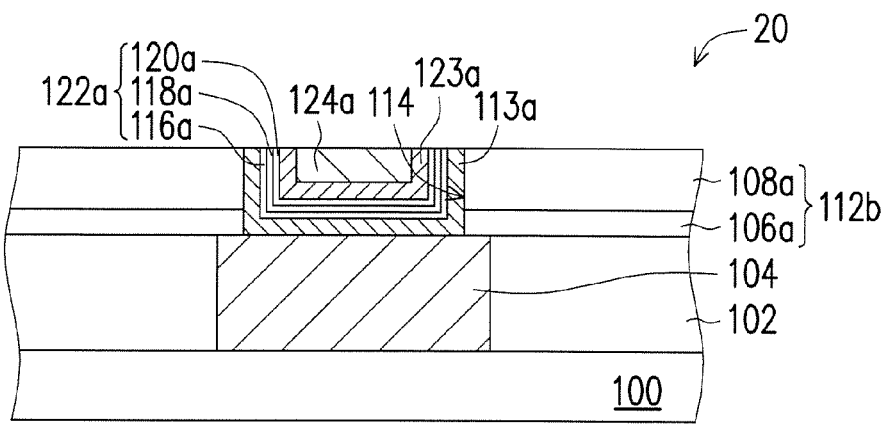

Referring to FIG. 1D, FIG. 1E and FIG. 2, in step 214, a planarization step is performed until a surface of the second dielectric layer 112a/112b is exposed. In some embodiments, the conductive layer 124, the top electrode 123, the MTJ layer 122, the bottom electrode 113 outside of the opening 114 are removed. Specifically, the conductive layer 124, the top electrode 123, the MTJ layer 122 and the bottom electrode 113 are partially removed to form a conductive layer 124a, a top electrode 123a, a MTJ layer 122a (including a fixed layer 116a, a free layer 120a and a tunnel layer 118a between the fixed layer 116a and the free layer 120a) and a bottom electrode 113a inside the opening 114. In some embodiments, the planarization step includes performing a chemical mechanical polishing (CMP) process by using the polishing stop layer 110a as a stop layer. The polishing stop layer 110a has a polishing resistance higher than that of the conductive layer 124, the top electrode 123, the MTJ layer 122 or the bottom electrode 113 during the planarization step. The polishing stop layer 110a prevents the planarization step from going down to the film stack inside the opening 114.

In some embodiments, the planarization step stops on the surface of the polishing stop layer 110a, as shown in FIG. 1D. A MRAM device 10 of the present disclosure is thus completed. In some embodiments, the MRAM device 10 has a resistance variable memory cell 105 constituted by the bottom electrode 113a, the MTJ layer 122a and the top electrode 123a and embedded in the second dielectric layer 112a.

In alternative embodiments, upon the process requirements, the planarization step removes the polishing stop layer 110a and stops on the surface of the interlayer 108a, as shown in FIG. 1E. A MRAM device 20 of the present disclosure is thus completed. In some embodiments, the MRAM device 20 has a resistance variable memory cell 105 constituted by the bottom electrode 113a, the MTJ layer 122a and the top electrode 123a and embedded in the second dielectric layer 112b.

Figure 3:
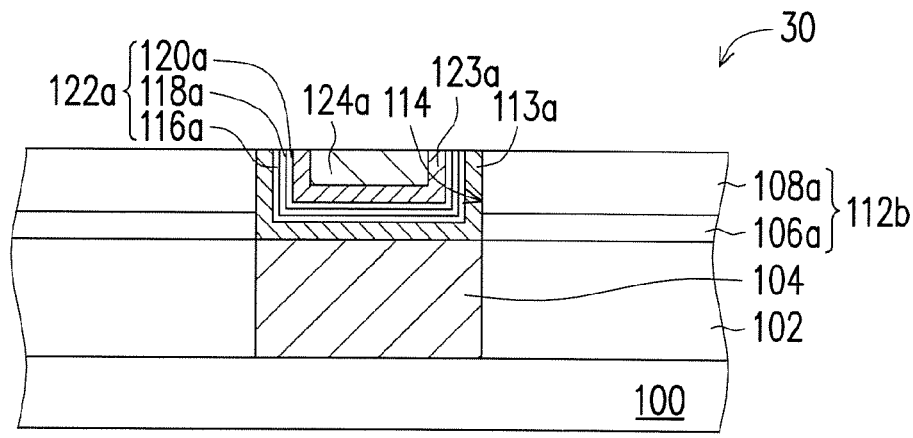
FIG. 3 to FIG. 4 are schematic cross-sectional views of MRAM devices in accordance with alternative embodiments.

In the above embodiments in which the width of the opening 114 is smaller than the width of the conductive structure 104, but the disclosure is not limited thereto. In alternative embodiments, the width of the opening 114 is substantially equal to the width of the conductive structure 104, as shown in FIG. 3. A MRAM device 30 of the present disclosure is thus completed. In some cases, the sidewall of the conductive structure 104 is aligned with the sidewall of the opening 114.

In yet alternative embodiment, the width of the opening 114 is greater than the width of the conductive structure 104. A MRAM device 40 of the present disclosure is thus completed.

Various MRAM devices of the present disclosure are provided with improved characteristics. Specifically, in the conventional method, multiple etching steps are required for patterning the bottom electrode, the MTJ layer and the top electrode, and such etching steps lead to long exposure period in plasma environments and therefore deteriorate the performance of the device. However, the resistance variable memory cell of the disclosure is formed by multiple filling steps (e.g., steps 206-210) followed by a single planarization step (e.g., step 214), without any conventional etching step. This disclosure eliminates drawbacks in the conventional method such as etching damage to the MTJ layer. Without etching damages in the MTJ layer, a possible leakage current in the MRAM device is reduced, and the performance of the device is accordingly boosted.

The structures of the MRAM devices of the disclosure are illustrated below with reference to FIG. 1D, FIG. 1E, FIG. 3 and FIG. 4.

In some embodiments, the present disclosure provides a MRAM device 10/20/30/40 which includes a substrate 100, a first dielectric layer 102, a conductive structure 104, a resistance variable memory cell 105, a second dielectric layer 112a/112b and a conductive layer 124a. The conductive structure 104 is over a substrate 100 and embedded in the first dielectric layer 102. In some embodiments, the conductive structure 104 includes at least one of a metal line, a metal plug, a metal gate, a polysilicon gate, a silicide layer and a doped layer.

Figure 4:
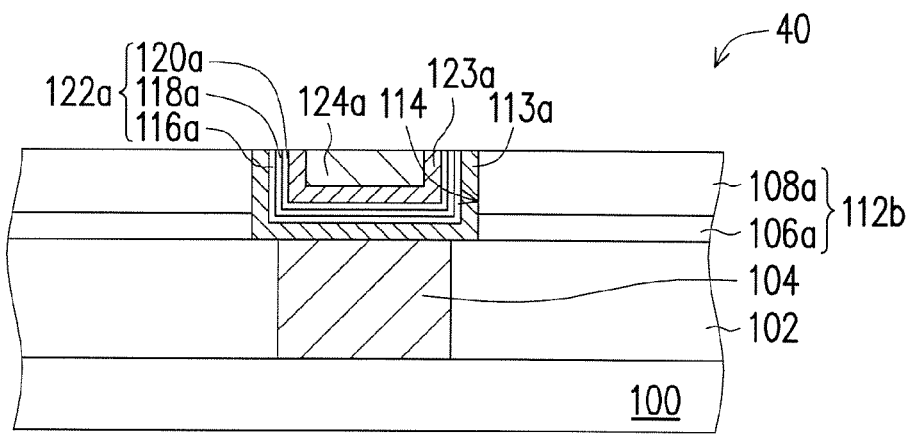

The second dielectric layer 112a/112b is over the substrate 100 and has an opening 114 that exposes the conductive structure 104. In some embodiments, the width of the opening 114 is smaller than the width of the conductive structure 104, as shown in FIG. 1D and FIG. 1E. In alternative embodiments, the width of the opening 114 is substantially equal to the width of the conductive structure 104, as shown in FIG. 3. In yet alternative embodiments, the width of the opening 114 is greater than the width of the conductive structure 104, as shown in FIG. 4.

In some embodiments, the second dielectric layer 112a includes an etching stop layer 106a, an interlayer 108a over the etching stop layer 106a, and a polishing stop layer 110a over the interlayer over 108a, as shown in FIG. 1D. In alternative embodiments, the second dielectric layer 112b includes an etching stop layer 106a and an interlayer 108a over the etching stop layer 106a, as shown in FIG. 1E, FIG. 3 and FIG. 4.

The conductive layer 124a is in the opening 114. In some embodiments, the top surface of the conductive layer 124a is substantially coplanar with the top surface of the second dielectric layer 112a/112b.

The resistance variable memory cell 105 is between the conductive layer 124a and the conductive structure 104 and between the conductive layer 124a and the second dielectric layer 112a/112b. In some embodiments, resistance variable memory cell 105 is in physical contact with each of the conductive structure 104 and the conductive layer 124a. In some embodiments, the resistance variable memory cell 105 includes a bottom electrode 113a, a top electrode 123a and a MTJ layer 122a between the bottom electrode 113a and the top electrode 123a. In some embodiments, the MTJ layer 122a includes a fixed layer 116a, a free layer 120a, and a tunnel layer 118a between the fixed layer 116a and the free layer 120a, the fixed layer 116a has a fixed magnetic polarity, and the free layer 120a has a changeable magnetic polarity.

In some embodiments, in the resistance variable memory cell 105, the bottom electrode 113a is on the sidewall and the bottom of the opening 114, the top electrode 123a is on the same sidewall and the bottom of the opening 114, and the MTJ layer 122a is between the bottom electrode 113a and the top electrode 123a. Specifically, each of the bottom electrode 113a, the MTJ layer 122a and the top electrode 123a is formed in a U-shape.

The present disclosure further provides a MRAM device 10/20/30/40 including a substrate 100, a dielectric layer (e.g., second dielectric layer 112a/112b), a resistance variable memory cell 105 and a conductive layer 124a. The dielectric layer (e.g., second dielectric layer 112a/112b) is over the substrate 100 and has an opening 114 therein. The resistance variable memory cell 105 is in the opening 114 and includes a first electrode (e.g., bottom electrode 113a), a second electrode (e.g., top electrode 123a) and a MTJ layer 122a between the first electrode and the second electrode. The conductive layer 124a fills a remaining portion of the opening 114 and is electrically connected to one of the first electrode (e.g., bottom electrode 113a) and the second electrode (e.g., top electrode 123a) of the resistance variable memory cell 105. Besides, the other of the first electrode (e.g., bottom electrode 113a) and the second electrode (e.g., top electrode 123a) of the resistance variable memory cell 105 is electrically connected to a conductive structure 104 below the dielectric layer (e.g., second dielectric layer 112a/112b). In some embodiments, the second electrode (e.g., top electrode 123a) of the resistance variable memory cell 105 is electrically connected to the conductive layer 124a within the opening 114, and the first electrode (e.g., bottom electrode 113a) of the resistance variable memory cell 105 is electrically connected to the conductive structure 104 below the opening 114.

The above embodiments in which each of the bottom electrode 113a, the MTJ layer 122a and the top electrode 123a is formed with a U-shape in the same opening 114 are provided for illustration purposes, and are not construed as limiting the present disclosure. That is, each of the bottom electrode, the MTJ layer and the top electrode is not necessary to be a U-shape and its shape can be adjusted as needed. Specifically, each of the bottom electrode, the MTJ layer and the top electrode can be formed with a suitable shape, such as an I-shape, an L-shape, a V-shape, a step-shaped or the like upon the process requirements. For example, the bottom electrode can be formed in a horizontal I-shape and merely disposed on the bottom of the opening, while the MTJ layer and the top electrode can be formed in a U-shape and disposed on the sidewall and bottom of the opening.

People having ordinary skill in the art should be appreciated that, a resistance variable memory cell is contemplated as falling within the spirit and scope of the present disclosure as long as this resistance variable memory cell is formed in an opening and one electrode thereof is electrically connected to or in physical contact with a conductive wire in the same opening. In some embodiments, such resistance variable memory cell can be formed by multiple filling steps followed by a single planarization step, without any conventional etching step which may damage the device. Therefore, the performance of the MRAM device can be accordingly improved.

In the above embodiments, the bottom electrode, the MTJ layer and the top electrode of the resistance variable memory cell are formed in the same opening without additional patterning steps, so the resistance variable memory cell of the disclosure is regarded as a self-aligned memory cell. The process steps are thus simplified and the process cost is therefore saved.

In some embodiments, the steps of forming the bottom electrode and the top electrode can be omitted from the method of FIG. 1A to FIG. 1E. In such case, the conductive structure 104 can serve as a bottom electrode and the conductive layer 124a can serve as a top electrode. The method of FIG. 5A to FIG. 5E is similar to the method of FIG. 1A to FIG. 1E, so the difference is illustrated in details below and the similarity is not iterated herein.

Figure 7:
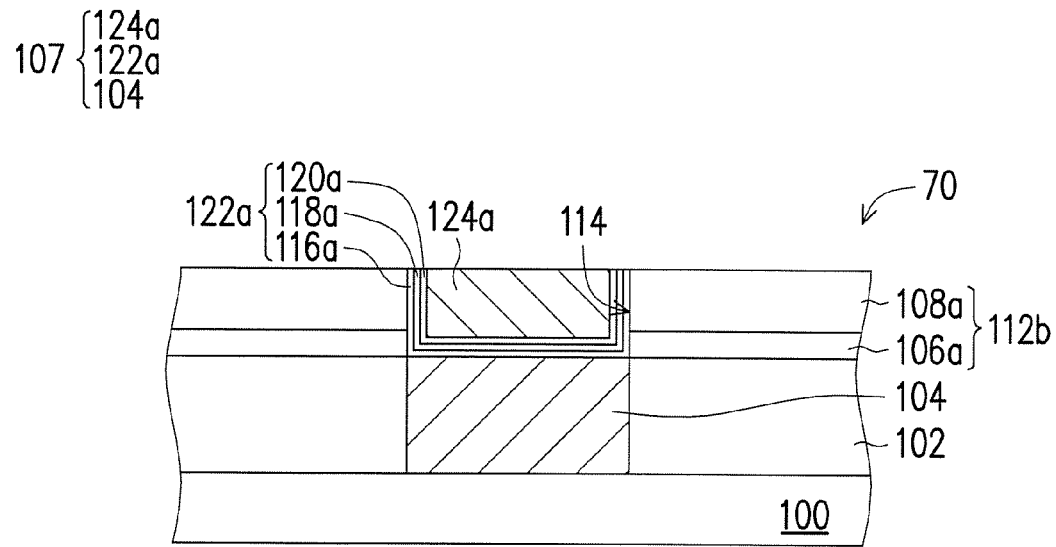
FIG. 7 to FIG. 8 are schematic cross-sectional views of MRAM devices in accordance with still alternative embodiments.
Figure 8:
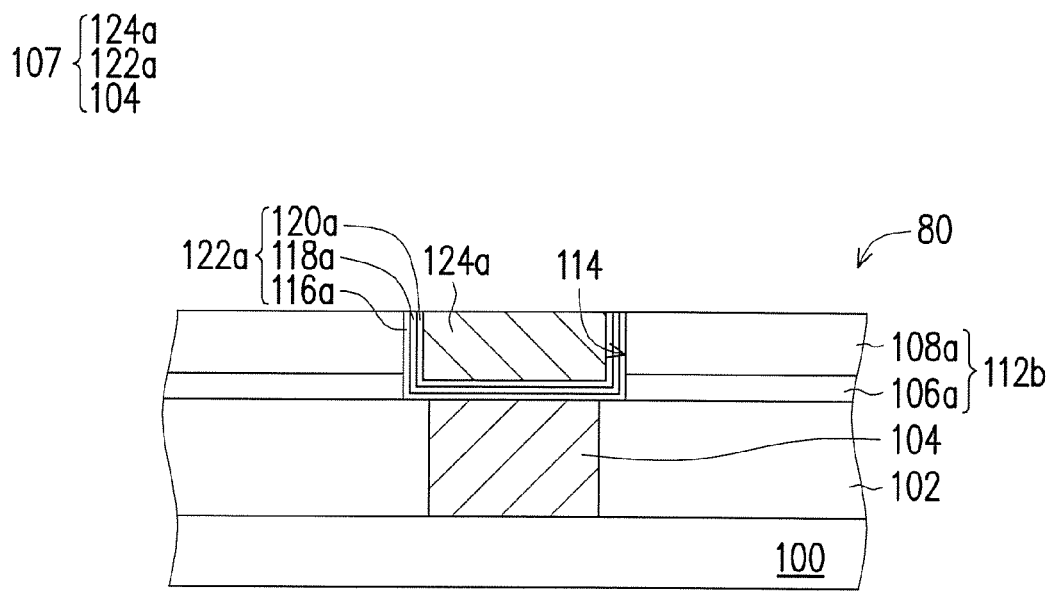

FIG. 5A to FIG. 5E are schematic cross-sectional views of MRAM devices in accordance with yet alternative embodiments. FIG. 6 is a flow chart of a method of forming a MRAM device in accordance with yet alternative embodiments. FIG. 7 to FIG. 8 are schematic cross-sectional views of MRAM devices in accordance with still alternative embodiments. It is noted that additional process steps may be provided before, during, or after the steps of FIG. 6. Various figures have been simplified for a better understanding of the inventive concepts of the present disclosure.

Figure 5A:
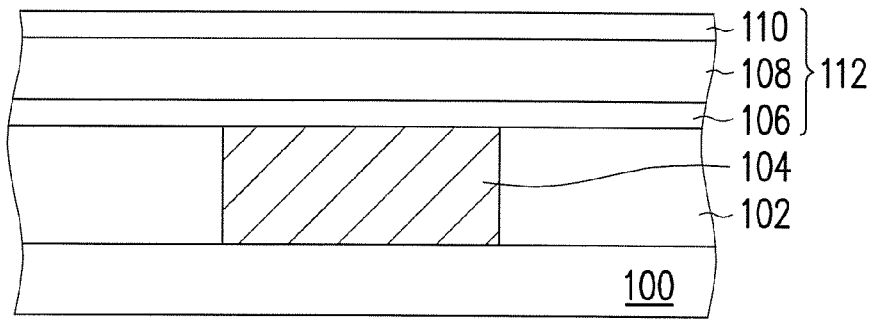
FIG. 5A to FIG. 5E are schematic cross-sectional views of MRAM devices in accordance with yet alternative embodiments.
Figure 6:
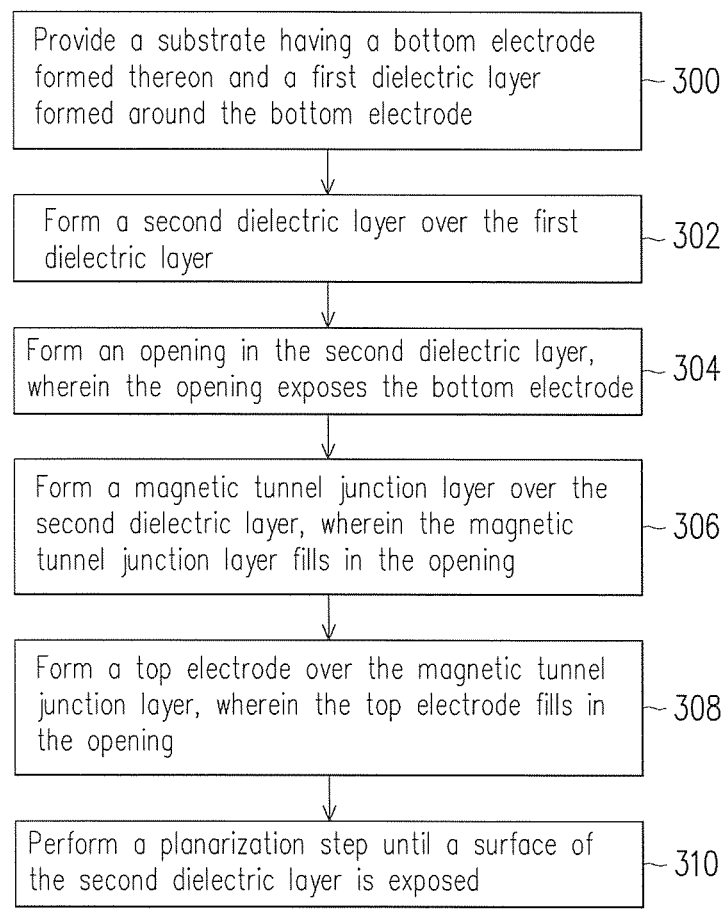
FIG. 6 is a flow chart of a method of forming a MRAM device in accordance with yet alternative embodiments.

Referring to FIG. 5A and FIG. 6, in step 300, a substrate 100 is provided with a bottom electrode (e.g., conductive structure 104) formed thereon and a first dielectric layer 102 formed around the bottom electrode.

Continue referring to FIG. 5A and FIG. 6, in step 302, a second dielectric layer 112 is formed over the first dielectric layer 102. In some embodiments, the second dielectric layer 112 includes, from bottom to top, an optional etching stop layer 106, an interlayer 108 and an optional polishing stop layer 110.

Figure 5B:
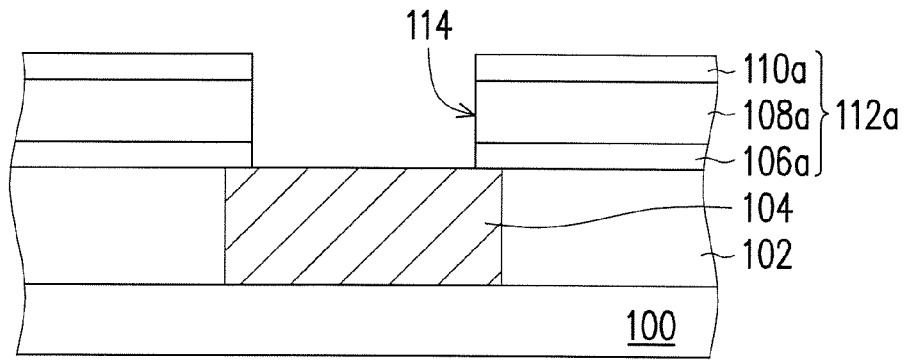

Referring to FIG. 5B and FIG. 6, in step 304, an opening 114 is formed in the second dielectric layer 112 and therefore exposes the bottom electrode (e.g., conductive structure 104). In some embodiments, the opening 114 penetrates through the second dielectric layer 112 and exposes at least a portion of the bottom electrode (e.g., conductive structure 104). Specifically, the second dielectric layer 112 is partially removed to form a second dielectric layer 112a including, from bottom to top, an optional etching stop layer 106a, an interlayer 108a and an optional polishing stop layer 110a.

Figure 5C:
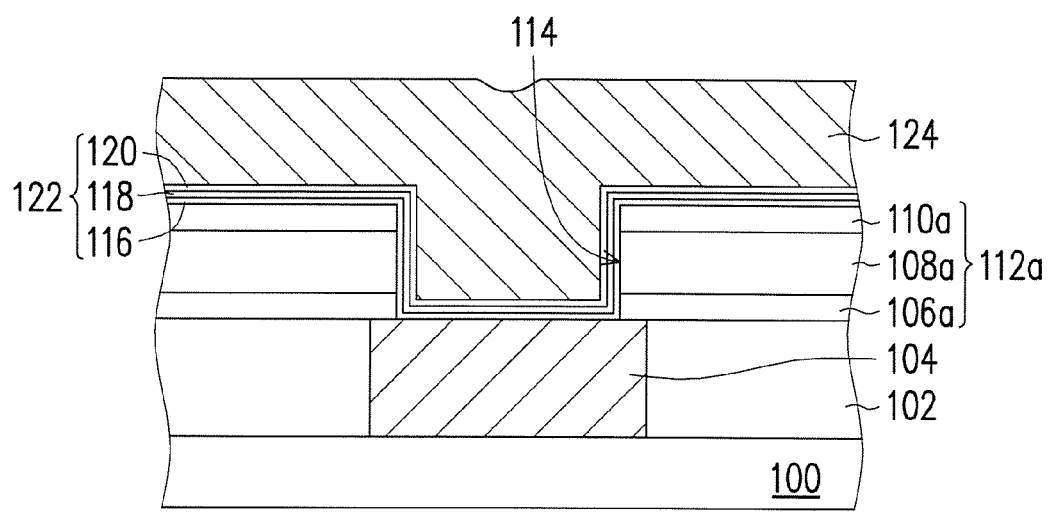

Referring to FIG. 5C and FIG. 6, in step 306, a MTJ layer 122 is formed over the second dielectric layer 112 and fills in the opening 114. In some embodiments, the MTJ layer 122 is conformally formed on the top surface of the second dielectric layer 112a and on the sidewall and bottom of the opening 114. In some embodiments, the MTJ layer 122 is in physical contact with the bottom electrode (e.g., conductive structure 104). In some embodiments, the MTJ layer 122 includes a fixed layer 116, a free layer 120 and a tunnel layer 118 between the fixed layer 116 and the free layer 120.

Continue referring to FIG. 5C and FIG. 6, in step 308, a top electrode (e.g., conductive layer 124) is formed over the MTJ layer 122 and fills in the opening 114. In some embodiments, the top electrode (e.g., conductive layer 124) fills up the opening 114.

Figure 5D:
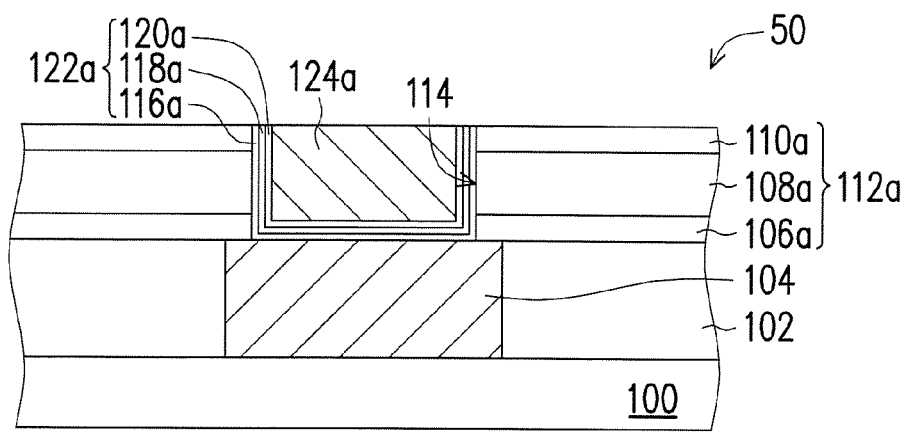
Figure 5E:
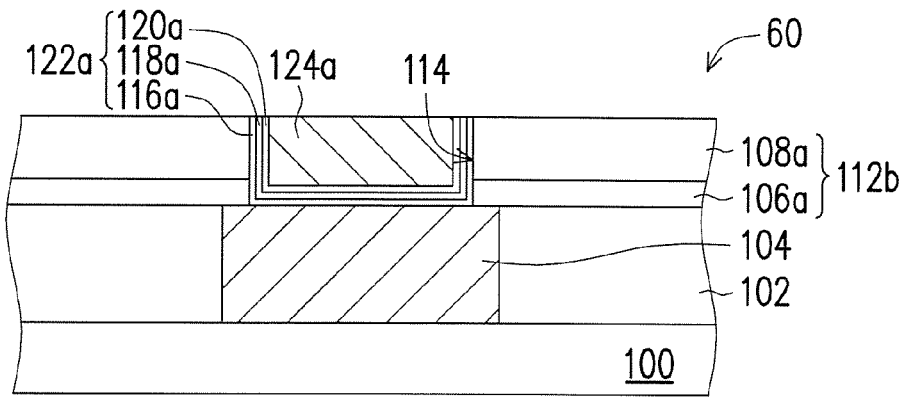

Referring to FIG. 5D, FIG. 5E and FIG. 6, in step 310, a planarization step is performed until a surface of the second dielectric layer 112a/112b is exposed. In some embodiments, the top electrode (e.g., conductive layer 124) and the MTJ layer 122 outside of the opening 114 are removed. Specifically, the top electrode (e.g., conductive layer 124) and the MTJ layer 122 are partially removed to form a top electrode (e.g., conductive layer 124a) and a MTJ layer 122a (including a fixed layer 116a, a free layer 120a and a tunnel layer 118a between the fixed layer 116a and the free layer 120a) inside the opening 114. In some embodiments, the planarization step includes performing a CMP process by using the polishing stop layer 110a as a stop layer.

In some embodiments, the planarization step stops on the surface of the polishing stop layer 110a, as shown in FIG. 5D. A MRAM device 50 of the present disclosure is thus completed. In some embodiments, the MRAM device 50 has a resistance variable memory cell 107 constituted by the bottom electrode (e.g., conductive structure 104), the MTJ layer 122a and the top electrode (e.g., conductive layer 124a) and embedded in the second dielectric layer 112a.

In alternative embodiments, upon the process requirements, the planarization step removes the polishing stop layer 110a and stops on the surface of the interlayer 108a, as shown in FIG. 5E. A MRAM device 60 of the present disclosure is thus completed. In some embodiments, the MRAM device 60 has a resistance variable memory cell 107 constituted by the bottom electrode (e.g., conductive structure 104), the MTJ layer 122a and the top electrode (e.g., conductive layer 124a) and embedded in the second dielectric layer 112b.

In the above embodiments in which the width of the opening 114 is smaller than the width of the bottom electrode (e.g., conductive structure 104), but the disclosure is not limited thereto. In alternative embodiments, the width of the opening 114 is substantially equal to the width of the bottom electrode (e.g., conductive structure 104), as shown in FIG. 7. A MRAM device 70 of the present disclosure is thus completed. In some cases, the sidewall of the bottom electrode (e.g., conductive structure 104) is aligned with the sidewall of the opening 114.

In yet alternative embodiment, the width of the opening 114 is greater than the width of the bottom electrode (e.g., conductive structure 104), as shown in FIG. 8. A MRAM device 80 of the present disclosure is thus completed.

In the process of forming the resistance variable memory cell 107, the bottom electrode (e.g., conductive structure 104) can be manufactured with the step of forming a metal line, a metal plug, a metal gate, a polysilicon gate, a silicide layer and/or a doped layer, and the top electrode (e.g., conductive layer 124a) can be manufactured with the step of forming a metal line or a metal plug. That is, the process of forming the resistance variable memory cell 107 can be easily integrated with the existing logic or CMOS process, so the process steps are thus simplified and the process cost is therefore saved.

In accordance with some embodiments of the present disclosure, a MRAM device includes a dielectric layer, a resistance variable memory cell and a conductive layer. The dielectric layer is over a substrate and has an opening. The resistance variable memory cell is in the opening and includes a first electrode, a second electrode and a MTJ layer between the first electrode and the second electrode. The conductive layer fills a remaining portion of the opening and is electrically connected to one of the first electrode and the second electrode of the resistance variable memory cell.

In accordance with alternative embodiments of the present disclosure, a MRAM device includes a conductive structure, a first dielectric layer, a second dielectric layer, a conductive layer and a resistance variable memory cell. The conductive structure is over a substrate and embedded in the first dielectric layer. The second dielectric layer is over the substrate and has an opening that exposes the conductive structure. The conductive layer is in the opening. The resistance variable memory cell is located between the conductive layer and the conductive structure and between the conductive layer and the second dielectric layer and includes a bottom electrode, a top electrode and a magnetic tunnel junction layer between the bottom electrode and the top electrode.

In accordance with yet alternative embodiments of the present disclosure a method of forming a MRAM device including the following steps. Providing is a substrate having a conductive structure formed thereon and a first dielectric layer formed around the conductive structure. A second dielectric layer is formed over the first dielectric layer. An opening is formed in the second dielectric layer, wherein the opening exposes the conductive structure. A bottom electrode is formed over the second dielectric layer and fills in the opening. A magnetic tunnel junction layer is formed over the bottom electrode and fills in the opening. A top electrode is formed over the magnetic tunnel junction layer and fills in the opening. A conductive layer is formed over the top electrode and fills in the opening. A planarization step is performed until a surface of the second dielectric layer is exposed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetoresistive random access memory (MRAM) device, comprising:
   a dielectric layer over a substrate and having an opening;
   a resistance variable memory cell in the opening and comprising a first electrode, a second electrode and a magnetic tunnel junction layer between the first electrode and the second electrode; and
   a conductive layer, filling a remaining portion of the opening and electrically connected to one of the first electrode and the second electrode of the resistance variable memory cell, wherein at least one of the first electrode, the magnetic tunnel junction layer and the second electrode has a U-shape in cross-section, wherein a top surface of the conductive layer is substantially coplanar with a top surface of one of the first electrode and the second electrode, and wherein the dielectric layer comprises an etching stop layer and an interlayer over the etching stop layer.

2. The MRAM device of claim 1, wherein a top surface of the conductive layer is substantially coplanar with a top surface of the dielectric layer.

3. The MRAM device of claim 1, wherein the resistance variable memory cell comprises:
the first electrode on a sidewall and a bottom of the opening;
the second electrode on the first electrode and in the opening; and
the magnetic tunnel junction layer between the first electrode and the second electrode.

4. The MRAM device of claim 1, wherein each of the first electrode and the second electrode comprises Pt, Al, Cu, AlCu, Au, Ti, TiN, Ta, TaN, W, WN or a combination thereof.

5. The MRAM device of claim 1, wherein the magnetic tunnel junction layer comprises a fixed layer, a free layer and a tunnel layer between the fixed layer and the free layer, the fixed layer has a fixed magnetic polarity, and the free layer has a changeable magnetic polarity.

6. The MRAM device of claim 1, wherein the other of the first electrode and the second electrode of the resistance variable memory cell is electrically connected to a conductive structure below the dielectric layer.

7. The MRAM device of claim 6, wherein a width of the opening is smaller than a width of the conductive structure.

8. The MRAM device of claim 6, wherein a width of the opening is substantially equal to a width of the conductive structure.

9. The MRAM device of claim 6, wherein a width of the opening is greater than a width of the conductive structure.

10. The MRAM device of claim 1, wherein the dielectric layer further comprises a polishing stop layer over the interlayer.

11. A magnetoresistive random access memory (MRAM) device, comprising:
a conductive structure over a substrate and embedded in a first dielectric layer;
a second dielectric layer over the substrate and having an opening that exposes the conductive structure;
a conductive layer in the opening; and
a resistance variable memory cell located between the conductive layer and the conductive structure and between the conductive layer and the second dielectric layer and comprising a bottom electrode, a top electrode and a magnetic tunnel junction layer between the bottom electrode and the top electrode,
wherein the conductive layer is physically separated from the second dielectric layer.

12. The MRAM device of claim 11, wherein each of the bottom electrode and the top electrode comprises Pt, Al, Cu, AlCu, Au, Ti, TiN, Ta, TaN, W, WN or a combination thereof.

13. The MRAM device of claim 11, wherein the magnetic tunnel junction layer comprises a fixed layer, a free layer and a tunnel layer between the fixed layer and the free layer, the fixed layer has a fixed magnetic polarity, and the free layer has a changeable magnetic polarity.

14. The MRAM device of claim 11, wherein the second dielectric layer comprises an etching stop layer and an interlayer over the etching stop layer.

15. The MRAM device of claim 11, wherein the second dielectric layer comprises an etching stop layer, an interlayer over the etching stop layer and a polishing stop layer over the interlayer.

16. The MRAM device of claim 11, wherein the conductive structure comprises at least one of a metal line, a metal plug, a metal gate, a polysilicon gate, a silicide layer and a doped layer.

17. A method of forming a magnetoresistive random access memory (MRAM) device, comprising:
providing a substrate having a conductive structure formed thereon and a first dielectric layer formed around the conductive structure;
forming a second dielectric layer over the first dielectric layer;
forming an opening in the second dielectric layer, wherein the opening exposes the conductive structure;
forming a bottom electrode over the second dielectric layer, wherein the bottom electrode fills in the opening;
forming a magnetic tunnel junction layer over the bottom electrode, wherein the magnetic tunnel junction layer fills in the opening;
forming a top electrode over the magnetic tunnel junction layer, wherein the top electrode fills in the opening;
forming a conductive layer over the top electrode, wherein the conductive layer fills in the opening; and
performing a planarization step until a surface of the second dielectric layer is exposed, such that the conductive layer is physically separated from the second dielectric layer.

18. The method of claim 17, wherein the planarization step comprises performing a chemical mechanical polishing process.

* * * * *